(12) United States Patent
Baur et al.

(10) Patent No.: US 8,368,092 B2
(45) Date of Patent: Feb. 5, 2013

(54) THIN FILM LED COMPRISING A CURRENT-DISPERSING STRUCTURE

(75) Inventors: Johannes Baur, Regensburg (DE); Berthold Hahn, Hemau (DE); Volker Härle, Laaber (DE); Raimund Oberschmid, Sinzing (DE); Andreas Weimar, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 861 days.

(21) Appl. No.: 10/587,666

(22) PCT Filed: Jan. 25, 2005

(86) PCT No.: PCT/DE2005/000099
§ 371 (c)(1),
(2), (4) Date: Jun. 21, 2007

(87) PCT Pub. No.: WO2005/071763
PCT Pub. Date: Aug. 4, 2005

(65) Prior Publication Data
US 2007/0278508 A1 Dec. 6, 2007

(30) Foreign Application Priority Data
Jan. 26, 2004 (DE) .......................... 10 2004 003 986

(51) Int. Cl.
*H01L 33/00* (2010.01)
(52) U.S. Cl. ................. 257/94; 257/95; 257/96; 257/97; 257/E33.027
(58) Field of Classification Search .................... 257/94, 257/E33.027
See application file for complete search history.

(56) References Cited

U.S. PATENT DOCUMENTS 5,008,718 A 4/1991 Fletcher et al.
(Continued)

FOREIGN PATENT DOCUMENTS

DE 196 40 594 A1 4/1998
DE 197 47 433 A1 5/1999
(Continued)

OTHER PUBLICATIONS

I. Schnitzer et al., "30% external quantum efficiency from surface textured, thin-film light-emitting diodes", Appl. Phys., vol. 63, No. 16, pp. 2174-2178, Oct. 18, 1993.
(Continued)

*Primary Examiner* — Lynne Gurley
*Assistant Examiner* — Hsin-Yi Hsieh
(74) *Attorney, Agent, or Firm* — Cozen O'Connor (57) ABSTRACT

A thin-film LED comprising an active layer (7) made of a nitride compound semiconductor, which emits electromagnetic radiation (19) in a main radiation direction (15). A current expansion layer (9) is disposed downstream of the active layer (7) in the main radiation direction (15) and is made of a first nitride compound semiconductor material. The radiation emitted in the main radiation direction (15) is coupled out through a main area (14), and a first contact layer (11, 12, 13) is arranged on the main area (14). The transverse conductivity of the current expansion layer (9) is increased by formation of a two-dimensional electron gas or hole gas. The two-dimensional electron gas or hole gas is advantageously formed by embedding at least one layer (10) made of a second nitride compound semiconductor material in the current expansion layer (9).

19 Claims, 4 Drawing Sheets

U.S. PATENT DOCUMENTS

| | | | |
|---|---|---|---|
| 5,233,204 | A | 8/1993 | Fletcher et al. |
| 5,744,828 | A | 4/1998 | Nozaki et al. |
| 5,861,636 | A | 1/1999 | Dutta et al. |
| 6,066,861 | A | 5/2000 | Höhn et al. |
| 6,172,382 | B1 | 1/2001 | Nagahama et al. |
| 6,222,205 | B1 | 4/2001 | Geng et al. |
| 6,448,591 | B1 | 9/2002 | Juengling |
| 6,541,797 | B1 | 4/2003 | Udagawa |
| 6,559,075 | B1 | 5/2003 | Kelly et al. |
| 6,649,942 | B2 | 11/2003 | Hata et al. |
| 6,650,018 | B1 | 11/2003 | Zhao et al. |
| 6,674,233 | B2 | 1/2004 | Ellens et al. |
| 6,787,882 | B2 | 9/2004 | Kirchoefer |
| 7,474,999 | B2 | 1/2009 | Scheffer |
| 2003/0006422 | A1 | 1/2003 | Miki et al. |
| 2003/0010993 | A1 | 1/2003 | Nakamura et al. |
| 2003/0057829 | A1 | 3/2003 | Ellens et al. |
| 2003/0102484 | A1 | 6/2003 | Hata et al. |
| 2003/0111667 | A1 | 6/2003 | Schubert |
| 2003/0209717 | A1 | 11/2003 | Okazaki |
| 2004/0004223 | A1 | 1/2004 | Nagahama et al. |
| 2005/0077538 | A1* | 4/2005 | Heikman ............. 257/183 |
| 2005/0239270 | A1 | 10/2005 | Fehrer et al. |
| 2006/0180804 | A1 | 8/2006 | Stauss et al. |
| 2006/0246687 | A1 | 11/2006 | Kaiser et al. |

FOREIGN PATENT DOCUMENTS

| | | |
|---|---|---|
| DE | 199 47 030 A1 | 4/2001 |
| DE | 697 10 539 T2 | 2/2002 |
| DE | 197 41 609 C2 | 2/2003 |
| DE | 201 15 914 U1 | 3/2003 |
| DE | 102 03 795 A1 | 8/2003 |
| DE | 103 03 977 A1 | 11/2003 |
| DE | 103 03 978 A1 | 11/2003 |
| DE | 102 43 757 A1 | 4/2004 |
| EP | 0 825 652 B1 | 7/1997 |
| EP | 1 406 314 A1 | 7/2002 |
| EP | 1 383 177 A1 | 7/2003 |
| JP | 11 340509 | 12/1999 |
| JP | 2000-068594 A | 3/2000 |
| JP | 2000-91638 | 3/2000 |
| JP | 2001-244503 A | 9/2001 |
| JP | 2002-204027 A | 7/2002 |
| JP | 2003 510853 | 3/2003 |
| JP | 2003-133589 | 5/2003 |
| JP | 2004-363572 | 12/2004 |
| JP | 2005-12092 | 1/2005 |
| JP | 2005-19653 | 1/2005 |
| WO | WO 98/12757 | 3/1998 |
| WO | WO 98/14986 | 4/1998 |
| WO | WO 03/052838 A2 | 6/2003 |

OTHER PUBLICATIONS

F.A. Kish et al., "Very high-efficiency semiconductor wafer-bonded transparent-substrate $(Al_xGa_{1-x})_{0.5}In_{0.5}P/GaP$ light-emitting diodes", Appl. Phys. Lett., vol. 64, No. 21, pp. 2839-2841, May 23, 1994.

Algora, "Large-Area Infrared-Emitting Diodes with an Output Optical Power Greater than 1W", IEEE Photonics Technology Letters, vol. 10, No. 3, pp. 331-333, Mar. 1998.

Notice to File a Response (Examination Report) issued in Korean Patent Application No. 10-2006-7016767 dated Apr. 29, 2011.

* cited by examiner

THIN FILM LED COMPRISING A CURRENT-DISPERSING STRUCTURE

RELATED APPLICATIONS

This is a U.S. national stage of application No. PCT/DE2005/000099, filed on 25 Jan. 2005.

This patent application claims the priority of German patent application no. 10 2004 003 986.0 filed Jan. 26, 2004, the disclosure content of which is hereby incorporated by reference.

FIELD OF THE INVENTION

The present invention is directed to a thin-film LED and, in particular, to a thin-film LED with an improved current expansion structure.

BACKGROUND OF THE INVENTION

A known method for producing optoelectronic components, in particular for producing light emitting diodes on the basis of nitride compound semiconductors, is based on so-called thin-film technology. In this method, a functional semiconductor layer sequence, which in particular comprises a radiation-emitting active layer, is firstly grown epitaxially on a growth substrate, then a new carrier is applied to the surface of the semiconductor layer sequence opposite to the growth substrate, and the growth substrate is subsequently separated off. The growth substrates used for nitride compound semiconductors, are relatively expensive. Examples of such growth substrates are SiC, sapphire and GaN. Because the growth substrates are comparatively expensive, this method affords the advantage, in particular, that the growth substrate is reusable. A growth substrate made of sapphire can be stripped away from a semiconductor layer sequence made of a nitride compound semiconductor for example by means of a laser lift-off method known from WO 98/14986.

A thin-film LED is distinguished in particular by the following characteristic features:
 a reflective layer (mirror layer) which reflects at least part of the electromagnetic radiation generated in the epitaxial layer sequence back into the latter is applied or formed at a main area of a radiation-generating epitaxial layer sequence that faces a carrier;
 the epitaxial layer sequence has a thickness in the region of 20 µm or less, in particular in the region of approximately 6 µm; and
 the epitaxial layer sequence contains at least one semiconductor layer with at least one area which has an intermixing structure which ideally leads to an approximately ergodic distribution of the light in the epitaxial layer sequence, that is to say that it has an as far as possible ergodically stochastic scattering behavior.

A basic principle of a thin-film LED is described for example in I. Schnitzer et al., Appl. Phys. Lett. 63 (16), Oct. 18, 1993, 2174-2176, the disclosure content of which is hereby incorporated by reference.

Electrical contact is made with thin-film LEDs generally by means of two electrical contact layers, for example by means of a p-type contact layer on the rear side of the carrier and an n-type contact layer on the side of the semiconductor layer sequence that is remote from the carrier. In general, the side of the thin-film LED that is remote from the carrier is provided for coupling out radiation, so that a contact layer that is non-transparent to the emitted radiation can only be applied to a partial region of the surface of the semiconductor layer sequence. For this reason, often only a comparatively small central region of the chip surface is provided with a contact area (bonding pad).

In conventional light-emitting diode chips having an edge length of less than 300 µm, in general a comparatively homogeneous current distribution in the semiconductor chip can already be achieved by means of a bonding pad arranged centrally on the chip surface.

In the case of large-area semiconductor chips having an edge length of approximately 1 mm, by way of example, this type of contact-making may, however, disadvantageously lead to an inhomogeneous current feed into the semiconductor chip, which leads to an increased forward voltage and to a lower quantum efficiency in the active zone. This effect occurs in particular in the case of semiconductor materials which have a low transverse conductivity, in particular in the case of nitride compound semiconductors. The maximum current density occurs in a central region of the semiconductor chip in this case. However, the radiation emitted in said central region of the semiconductor chip is at least partly emitted toward the non-transparent bonding pad and thus at least partly absorbed.

In order to improve the current expansion, it is known for example to apply a thin semitransparent metalization layer, for example Pt or NiAu, over the whole area of the chip surface of a p-type semiconductor material. In this case, however, a non-negligible part of the emitted radiation, for example approximately 50%, is absorbed in the semitransparent layer. Furthermore, such contact layers are not readily suitable for making contact with n-doped nitride compound semiconductors.

In order to improve the coupling-in of current in the case of InGaAlP LEDs, it is known from DE 199 47 030 A1 (which corresponds to U.S. patent application Ser. No. 10/089,017) to use a relatively thick, transparent current expansion layer provided with a laterally patterned electrical contact layer. In this case, the current is impressed through a central bonding pad and also through a plurality of contact webs connected to the bonding pad on the chip surface. This type of contact-making cannot readily be applied to large-area light-emitting diode chips which contain a semiconductor material having a low transverse conductivity, in particular nitride compound semiconductors, since the density of the non-transparent contact webs on the chip surface would have to be increased in such a way that a large part of the emitted radiation would be absorbed in the contact layer. A comparatively thick current expansion layer furthermore leads to an increased voltage drop and takes up a long growth time during production. Furthermore, strains may occur in a comparatively thick current expansion layer and cracks may possibly be induced by said strains.

SUMMARY OF THE INVENTION

One object of the present invention is to provide a thin-film LED comprising an improved current expansion structure which is distinguished in particular by a comparatively homogeneous current distribution over the chip area in conjunction with comparatively little shading of the chip surface by contact layer material.

This and other objects are attained in accordance with one aspect of the invention directed to a thin-film LED comprising an active layer, which emits electromagnetic radiation in a main radiation direction, a current expansion layer, which is disposed downstream of the active layer in the main radiation direction and is made of a first nitride compound semiconductor material, a main area, through which the radiation emitted in the main radiation direction is coupled out, and a first contact layer arranged on the main area. The transverse conductivity of the current expansion layer is increased by formation of a two-dimensional electron gas or hole gas.

The increased transverse conductivity of the current expansion layer leads to a homogeneous current feed into the active layer and thereby increases the efficiency of the thin-film LED.

In order to form a two-dimensional electron gas or hole gas in the current expansion layer, at least one layer made of a second nitride compound semiconductor material having a larger electronic band gap than the first nitride compound semiconductor material is preferably embedded in the current expansion layer.

The first nitride compound semiconductor material and the second nitride compound semiconductor material advantageously each have the composition $In_xAl_yGa_{1-x-y}N$ where $0 \leq x \leq 1$, $0 \leq y \leq 1$ and $x+y \leq 1$, the composition of the second nitride compound semiconductor material differing from the composition of the first nitride compound semiconductor material in such a way that the electronic band gap of the second nitride compound semiconductor material is larger than that of the first nitride compound semiconductor material. In this case, the respective material need not necessarily have a mathematically exact composition according to the above formula. Rather, it may have one or a plurality of dopants and also additional constituents which essentially do not change the physical properties of the material. For the sake of simplicity, however, the above formula includes only the essential constituents of the crystal lattice (Al, Ga, In, N) even though these may be replaced in part by small quantities of further substances.

Regions having a particularly high transverse conductivity form at the interfaces between the at least one layer made of the second nitride compound semiconductor material and the current expansion layer made of the first nitride compound semiconductor material. The increased transverse conductivity of these regions can be explained in the band model such that, at the interfaces between the first nitride compound semiconductor material and the second nitride compound semiconductor material, a bending of the band edges of the conduction band and of the valence band occurs in each case and leads to the formation of a potential well in which a two-dimensional electron or hole gas having a particularly high transverse conductivity occurs.

In one preferred embodiment of a thin-film LED according to the invention, a plurality of layers made of the second nitride compound semiconductor material are embedded in the current expansion layer. In this way, a multiplicity of interfaces between the first nitride compound semiconductor material and the second nitride compound semiconductor material are advantageously formed at each of which, on account of the band bending, a potential well forms in which a two-dimensional electron or hole gas having a high transverse conductivity occurs. The transverse conductivity of the entire current expansion layer is thereby increased further in comparison with a current expansion layer having only one embedded layer having a larger electronic band gap than the first nitride compound semiconductor material. The number of layers made of the second nitride compound semiconductor material is preferably between 1 and 5 inclusive.

The thickness of the at least one layer made of the second nitride compound semiconductor material is approximately 10 nm to 100 nm, by way of example.

The first nitride compound semiconductor material, from which the current expansion layer is formed, is preferably GaN. The second nitride compound semiconductor material is for example $Al_xGa_{1-x}N$ where $0<x \leq 1$, in which case $0.1 \leq x \leq 0.2$ preferably holds true.

The at least one layer made of the second nitride compound semiconductor material preferably has a doping, the dopant concentration being higher in the regions adjoining the current expansion layer than in a central region of the layer. The increased dopant concentration in the regions of the second nitride compound semiconductor material which adjoin the current expansion layer has the advantage that an increased number of free charge carriers are present in the regions in which the transverse conductivity is increased by the formation of a two-dimensional electron or hole gas. The transverse conductivity and the current expansion are improved further as a result.

The first and second nitride compound semiconductor materials are in each case n-doped, by way of example. In this case, a two-dimensional electron gas forms at the interfaces between the first and second nitride compound semiconductor materials. As an alternative, it is also possible for both the first and the second nitride compound semiconductor material to be p-doped in each case. In contrast to the case mentioned previously, here a two-dimensional hole gas rather than a two-dimensional electron gas forms at the interface between the first and second nitride compound semiconductor materials. A further advantageous variant of the invention provides for embedding a very thin n-doped layer made of the second nitride compound semiconductor material in a current expansion layer made of a p-doped first nitride compound semiconductor material. In this case, a two-dimensional electron gas can be generated in a p-doped first nitride compound semiconductor material as well.

The active layer of the thin-film LED comprises for example $In_xAl_yGa_{1-x-y}N$ where $0 \leq x \leq 1$, $0 \leq y \leq 1$ and $x+y \leq 1$. The active layer may be formed for example as a heterostructure, double heterostructure or as a quantum well structure. In this case, the designation quantum well structure encompasses any structure in which charge carriers experience a quantization of their energy states as a result of confinement. In particular, the designation quantum well structure does not comprise any indication about the dimensionality of the quantization. It thus encompasses, inter alia, quantum wells, quantum wires and quantum dots and any combination of these structures.

In one embodiment of the thin-film LED, at least one edge length of the main area provided for coupling out radiation is 400 μm or more, particularly preferably 800 μm or more. In particular, provision may even be made of an edge length of 1 mm or more, it being possible for the main area to have, in particular, a square form. As a result of the increase in the transverse conductivity of the current expansion layer, it is possible, even in the case of large-area thin-film LEDs, to obtain a comparatively homogeneous current distribution in the active layer which could not readily be realized otherwise with a conventional current expansion layer made of a nitride compound semiconductor material.

The first contact layer of the thin-film LED, which is arranged on the main area provided for coupling out radiation, preferably contains a metal or a metal alloy. The first contact layer is preferably a Ti—Pt—Au layer sequence comprising, proceeding from the adjoining nitride compound semiconductor layer, by way of example, a Ti layer having a thickness of approximately 50 nm, a Pt layer having a thickness of approximately 50 nm and an Au layer having a thickness of approximately 2 μm. A Ti—Pt—Au layer sequence is advantageously insensitive to electromigration which might otherwise occur, for example in the case of a first contact layer containing aluminum. Therefore, the first contact layer is preferably free of aluminum.

The first contact layer advantageously has a lateral structure comprising a contact area (bonding pad) and a plurality of contact webs. In one preferred embodiment, the contact area is surrounded by at least one frame-type contact web, the frame-type contact web being connected to the contact area by means of at least one further contact web. The at least one frame-type contact web may have for example a square, rectangular or circular form.

On account of the increased transverse conductivity of the current expansion layer, in the case of a thin-film LED according to the invention, it is advantageously necessary for only a comparatively small proportion of the main area to be covered by the contact layer. Advantageously, only less than 15%, particularly preferably less than 10%, of the total area of the main area is covered by the first contact layer. The good transverse conductivity of the current expansion layer furthermore has the advantage that even a comparatively coarse patterning of the contact layer suffices to produce a comparatively homogeneous current density distribution in the active layer in the thin-film LED. By way of example, the contact area is advantageously surrounded by 1, 2 or 3 frame-type contact webs. Finer patterning of the contact layer, in particular the use of a larger number of frame-type contact webs, is not necessary in order to increase the efficiency of the thin-film LED on account of the high transverse conductivity of the current expansion layer. The outlay for the patterning of the first contact layer is therefore advantageously low.

A further preferred embodiment contains a second contact layer, which, as seen from the active layer, is situated opposite to the first contact layer. The second contact layer has a cutout in a region opposite the contact area. The second contact layer is thus patterned in such a way that, as seen from the active layer, a region not covered by the second contact layer is situated opposite the contact area which together with at least one contact web forms the first contact layer. This has the advantage that the current density is reduced in a region of the active layer which lies below the contact area. This is advantageous in particular if the first contact layer comprises a non-transparent metal, because otherwise at least part of the radiation generated below the contact area would be absorbed in the contact area. The efficiency of the thin-film LED is advantageously increased in this way.

The second contact layer is preferably a layer that is reflective for the emitted radiation. This is advantageous in particular when the thin-film LED is connected to a carrier by means of a connecting layer, for example a solder layer, at an area opposite to the main area. In this case, the radiation emitted in the direction of the carrier is reflected back from the reflective contact layer toward the main area and the absorption of radiation in the carrier and/or the connecting layer is reduced in this way.

The invention is particularly advantageous for thin-film LEDs which are operated with a current intensity of 300 mA or more, since an inhomogeneous current distribution that would have a maximum in a central region of the light-emitting diode chip would be observed at such high operating current intensities in conventional thin-film LEDs.

DETAILED DESCRIPTION OF THE DRAWINGS

Identical or identically acting elements are provided with the same reference symbols in the Figures.

Figure 1A:
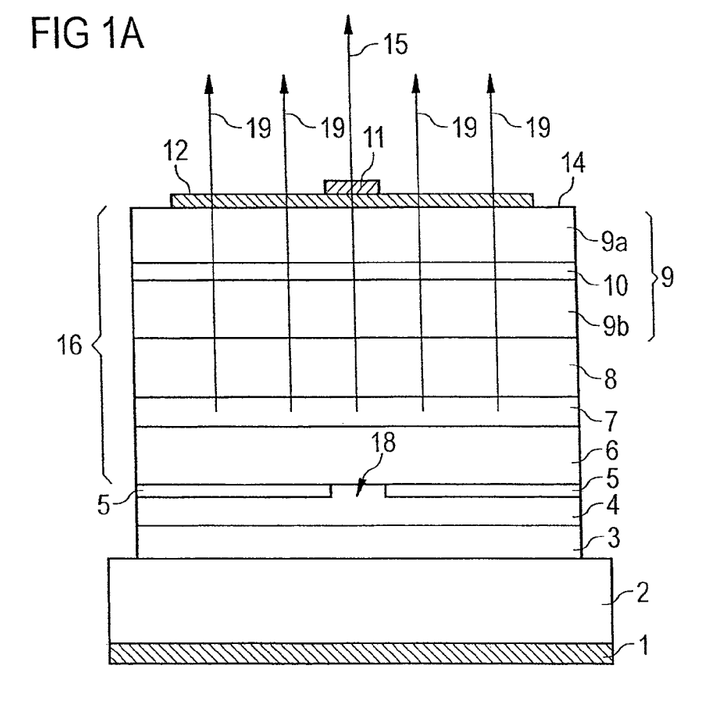
FIG. 1A shows a schematic illustration of a cross section through a thin-film LED in accordance with a first exemplary embodiment of the invention.
Figure 1B:
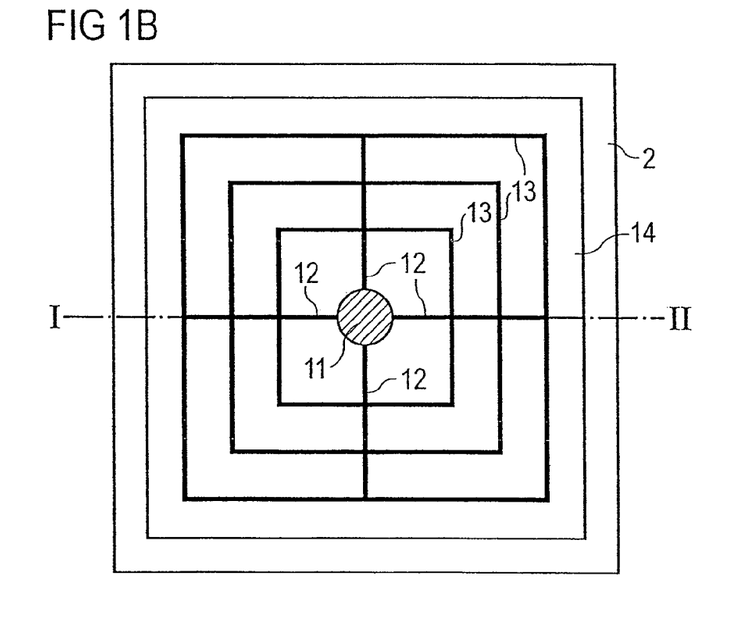
FIG. 1B shows a schematic illustration of a plan view of the thin-film LED in accordance with the first exemplary embodiment of the invention.

The thin-film LED in accordance with a first exemplary embodiment of the invention as illustrated in FIG. 1A along a cross section of the line I-II from the plan view shown in FIG. 1B contains an epitaxial layer sequence 16 comprising an active layer 7. The active layer 7 is formed for example as a heterostructure, double heterostructure or as a quantum well structure. The active layer 7 emits electromagnetic radiation 19, for example in the ultraviolet, blue or green spectral range, in a main radiation direction 15. The active layer 7 is contained for example between at least one p-doped semiconductor layer 6 and at least one n-doped semiconductor layer 8. The electromagnetic radiation 19 emitted in the main radiation direction 15 by the active layer 7 is coupled out from the thin-film LED through a main area 14.

On an opposite side to the main area 14, the epitaxial layer sequence 16 is fixed on a carrier 2 by means of a connecting layer 3, for example a solder layer. The rear side of the carrier is provided with an electrode 1, by way of example.

In order to make electrical contact with the epitaxial layer sequence 16 of the thin-film LED, a first contact layer 11, 12, 13 is provided on the main area 14 of the thin-film LED. A current expansion layer 9 containing a first nitride compound semiconductor material, preferably GaN, is contained between the active layer 7 and the first contact layer 11, 12, 13. Embedded in the current expansion layer 9 made of the first nitride compound semiconductor material is at least one layer 10 made of a second nitride compound semiconductor material, preferably made of AlGaN, that is to say that the current expansion layer 9 is a multilayer layer comprising for example two GaN partial layers 9a, 9b separated from one another by an embedded AlGaN layer 10. The AlGaN layer 10 preferably has the composition $Al_xGa_{1-x}N$ where $0.1 \leq x \leq 0.2$.

As will be explained in greater detail below, the transverse conductivity of the current expansion layer 9 is improved by the semiconductor layer 10 embedded in the current expansion layer 9. The layer 10 made of the second nitride compound semiconductor material and embedded in the current expansion layer 9 preferably has a thickness of from 10 nm to 100 nm inclusive.

The first contact layer 11, 12, 13 preferably comprises a Ti—Pt—Au layer sequence (not illustrated) comprising, proceeding from the adjoining current expansion layer 10, by way of example, a Ti layer having a thickness of approximately 50 nm, a Pt layer having a thickness of approximately 50 nm and an Au layer having a thickness of approximately 2 μm. In order to avoid electromigration, the first contact layer 11, 12, 13 preferably contains no aluminum. The lateral structure of the first contact layer 11, 12, 13 arranged on the main area 14 of the thin-film LED is illustrated in the plan view illustrated in FIG. 1B. The first contact layer comprises a contact area 11 arranged in a central region of the main area 14. The first contact layer furthermore comprises a plurality of contact webs 12 which run from the contact area 11 in the radial direction toward the edge of the thin-film LED. Said contact webs 12 are connected to one another at least in part by means of further frame-type contact webs 13 enclosing the contact area 11.

The frame-type contact webs 13 may be embodied as squares or rectangles nested in one another, as illustrated. As an alternative, by way of example, circular frames or frames in the form of regular polygons would also be possible, the frame-type contact webs 13 preferably being arranged concentrically, that is to say having a common mid-point, at which the contact area 11 is preferably arranged. The number of frame-type contact webs is preferably 1, 2 or 3. The first contact layer comprising the contact area 11 and the contact webs 12, 13 is preferably formed from a metal, in particular from aluminum.

A second contact layer 5, which preferably produces an ohmic contact to the adjoining semiconductor layer 6, adjoins that side of the semiconductor layer sequence 16 of the thin-film LED which faces the carrier 2. The second contact layer 5 preferably contains a metal such as, for example, aluminum, silver or gold. In the case of a p-doped semiconductor layer 6 adjoining the second contact layer 5, silver, in particular, is a suitable material for the second contact layer 5 since silver produces a good ohmic contact to p-doped nitride compound semiconductors.

The second contact layer 5 is preferably a layer that reflects the emitted radiation. This has the advantage that electromagnetic radiation emitted in the direction of the carrier 2 by the active layer 7 is reflected at least in part toward the main area 14 and is coupled out there from the thin-film LED. Absorption losses that might occur for example within the carrier 2 or in the connecting layer 3 are reduced in this way.

The second contact layer 5 preferably has a cutout 18 in a region situated opposite the contact area 11 of the first contact layer. The size and the form of the cutout 18 preferably essentially match the size and the form of the contact area 11. Since no ohmic contact between the second contact layer 5 and the adjoining semiconductor layer 6 arises in the region of the cutout 18, there is a reduction of the current flow between the first contact layer 11, 12, 13 on the main area 14 and the electrode 1 on the rear side of the carrier 2 through the region of the cutout 18. The current flow through a region of the active layer 7 which is arranged between the first contact area 11 and the cutout 18 in the second contact layer 5 is advantageously reduced in this way. The generation of radiation in this region of the active layer 7 is consequently reduced, as a result of which the absorption of radiation within the non-transparent contact area 11 is advantageously at least partly reduced.

A barrier layer 4 is preferably contained between the second contact layer 5 and the connecting layer 3. The barrier layer 4 contains TiWN, by way of example. The barrier layer 4 prevents, in particular, a diffusion of material of the connecting layer 3, which is a solder layer for example, into the second contact layer which might impair in particular the reflection of the second contact layer 5 functioning as a mirror layer.

Figure 2A:
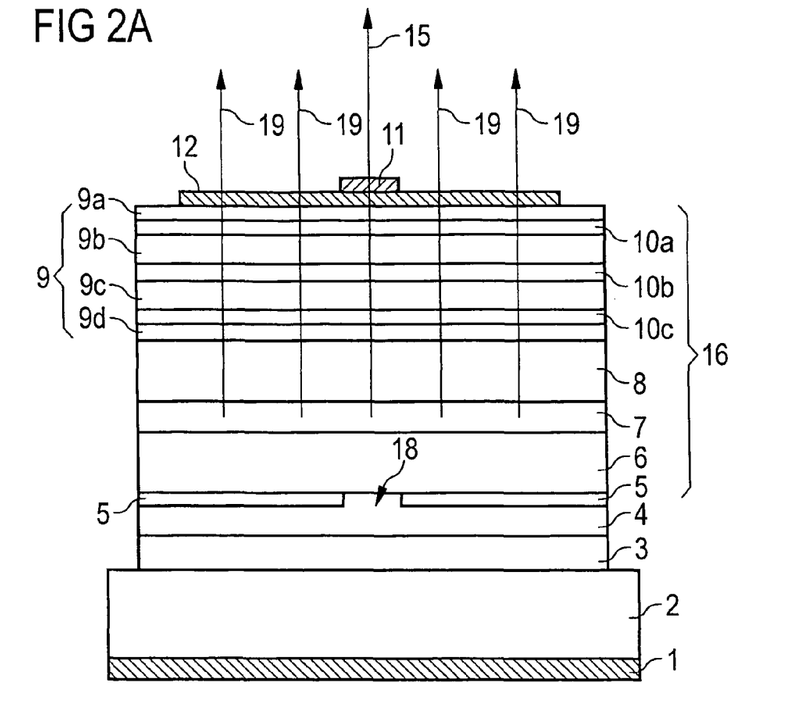
FIG. 2A shows a schematic illustration of a cross section through a thin-film LED in accordance with a second exemplary embodiment of the invention.
Figure 2B:
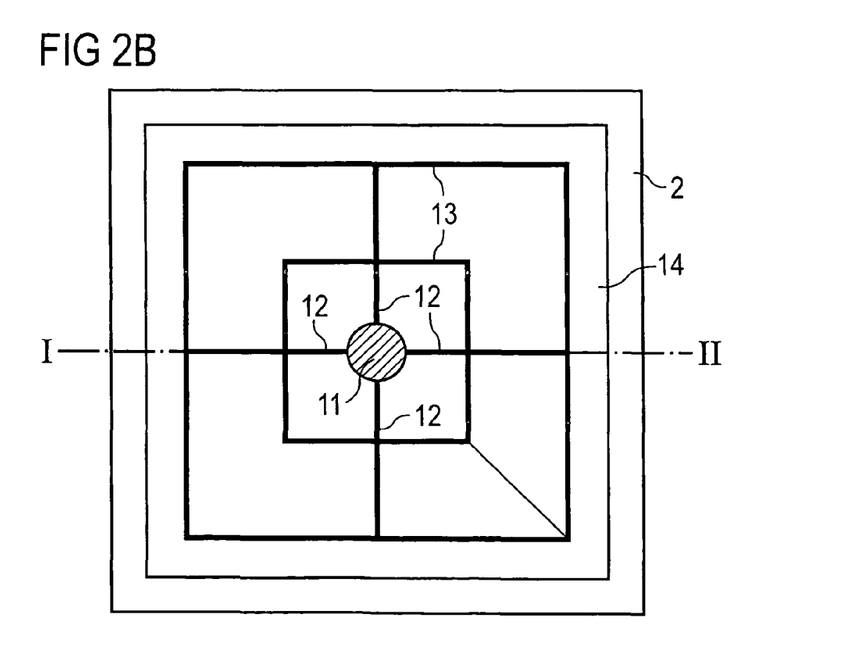
FIG. 2B shows a schematic illustration of a plan view of the thin-film LED in accordance with the second exemplary embodiment of the invention.

The second exemplary embodiment of a thin-film LED according to the invention as illustrated schematically in a cross section in FIG. 2A and in a plan view in FIG. 2B differs from the first exemplary embodiment of the invention as illustrated in FIG. 1 first of all by virtue of the fact that, instead of a single layer, three layers 10a, 10b, 10c made of the second nitride compound semiconductor material are embedded in the current expansion layer 9, that is to say that the current expansion layer 9 is a multilayer layer comprising for example four GaN partial layers 9a, 9b, 9c, 9d separated from one another by three embedded AlGaN layers 10a, 10b, 10c. As an alternative, still further layers made of the second nitride compound semiconductor material could also be embedded in the current expansion layer 9 made of the first nitride compound semiconductor material.

A preferred number of the embedded layers is between 1 and 5. The plurality of layers 10a, 10b, 10c each have a thickness of from 10 nm to 100 nm and need not necessarily be arranged periodically. By way of example, the layers 10a, 10b, 10c have different thicknesses and/or are at different distances from one another.

By virtue of the plurality of embedded layers 10a, 10b, 10c made of the second nitride compound semiconductor material, the transverse conductivity of the current expansion layer 9 is advantageously increased further in comparison with the embodiment with an individual embedded layer as illustrated in FIG. 1. By way of example, three layers 10a, 10b, 10c embedded in the current expansion layer 9 result in the production of six interfaces between the first nitride compound semiconductor material and the second nitride compound semiconductor material having the larger electronic band gap. At each of said interfaces a respective potential well for electrons forms within which the electrons have a particularly high mobility.

One advantage of increasing the transverse conductivity of the current expansion layer is that by embedding the layers 10a, 10b, 10c made of the second nitride compound semiconductor material in the current expansion layer 9, the transverse conductivity of the current expansion layer 9 is increased in such a way that the number of contact webs, the distance between the contact webs and the chip area covered by the contact webs 12, 13 and the contact area 11 can be reduced without thereby significantly impairing the current expansion within the thin-film LED.

As can be discerned in the plan view illustrated in FIG. 2B, the second exemplary embodiment of the invention differs from the first exemplary embodiment of the invention furthermore by virtue of the fact that the first contact layer on the main area 14 comprises only two frame-type contact webs 13 instead of three frame-type contact webs 13. By increasing the transverse conductivity of the current expansion layer 9, it is thus possible to simplify the structure of the first contact layer 11, 12, 13, thereby reducing the production outlay and reducing the absorption of radiation within the contact layer 11, 12, 13.

Figure 3A:
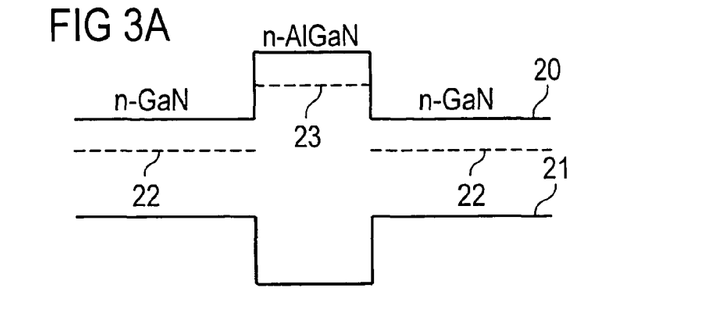
FIGS. 3A and 3B show a schematic illustration of the electronic band structure of an n-doped semiconductor layer in which an n-doped layer having a larger electronic band gap made of a second semiconductor material is embedded.

The increase in the transverse conductivity by the formation of a two-dimensional electron or hole gas is explained in more detail below with reference to FIGS. 3 to 7. FIG. 3A schematically illustrates the electronic band structure in the band model of a semiconductor layer made of a nitride compound semiconductor material, for example n-doped GaN, in which is embedded a semiconductor layer made of a second nitride compound semiconductor material having a larger electronic band gap, for example n-doped AlGaN. FIG. 3A schematically shows the profile of the conduction band 20, and of the valence band 21, and also the Fermi level 22 of GaN and the Fermi level 23 of AlGaN, the interaction between the semiconductor materials not having been taken into account. On account of the larger electronic band gap of AlGaN in comparison with GaN, the distance between the conduction band 20 and the valence band 21 is greater in the AlGaN layer embedded in the GaN layer than in the adjoining GaN layer.

Figure 3B:
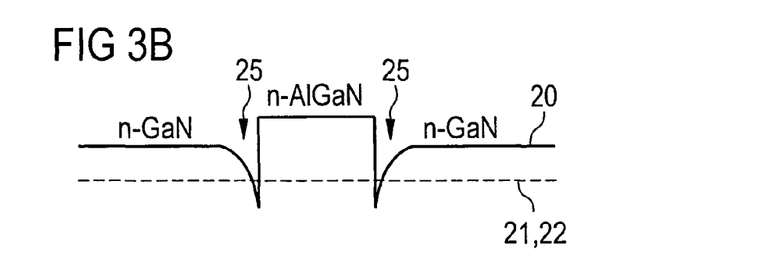

FIG. 3B shows the profile of the conduction band edge 21 taking account of the interaction of the two semiconductor materials. Since the Fermi levels 22, 23 match one another, a band bending occurs in the regions of the GaN layer adjoining the AlGaN layer such that in these regions a respective potential well 25 for electrons forms in which the electrons have such a high mobility that a two-dimensional electron gas forms in this region.

Figure 4:
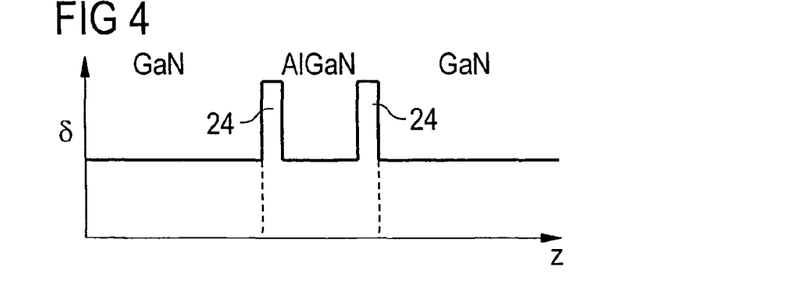
FIG. 4 shows a schematic illustration of the profile of the dopant concentration of the semiconductor layers illustrated in FIG. 2A

FIG. 4 schematically illustrates the profile of the dopant concentration δ as a function of a spatial coordinate z, which runs perpendicular to the current expansion layer, that is to say parallel to the main radiating direction, for a preferred embodiment of the current expansion layer. In this exemplary embodiment, an AlGaN layer is embedded in a current expansion layer made of GaN, both the GaN layer and the AlGaN layer being n-doped in each case. The AlGaN layer has a higher dopant concentration in the regions 24 adjoining the GaN layer than in its inner portion (so-called doping spikes). The number of free electrons which have a high mobility in the potential wells 25 illustrated in FIG. 3B is therefore increased further and the transverse conductivity is consequently improved further.

Figure 5:
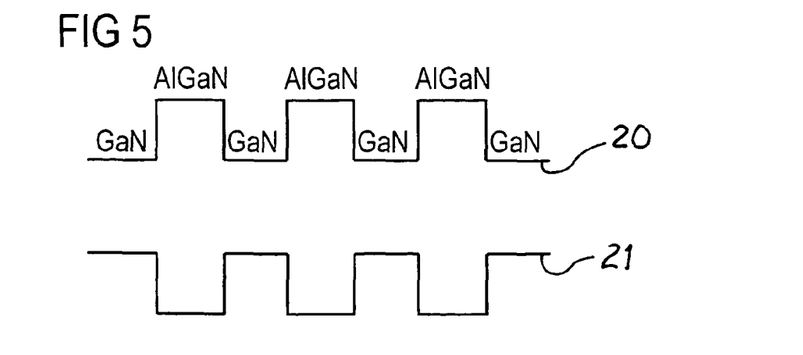
FIG. 5 shows a schematic illustration of the band model of a semiconductor layer in which a plurality of semiconductor layers made of a second semiconductor material having a larger electronic band gap are embedded.

Instead of embedding only a single layer made of a second nitride compound semiconductor material in a current expansion layer made of a first nitride compound semiconductor material, as was illustrated on the basis of the band model in FIG. 3, it is also possible to insert a plurality of layers made of the second nitride compound semiconductor material, as was explained above for example on the basis of the second exemplary embodiment of the invention. FIG. 5 illustrates for this case the profile of the conduction band 20 and of the valence band 21 without taking account of the interaction between the semiconductor materials, for example GaN and AlGaN. Taking account of the interaction, the band bending explained in connection with FIG. 3B and the corresponding formation of potential wells (not illustrated) occur in each case at each of the interfaces between the semiconductor materials.

Figure 6:
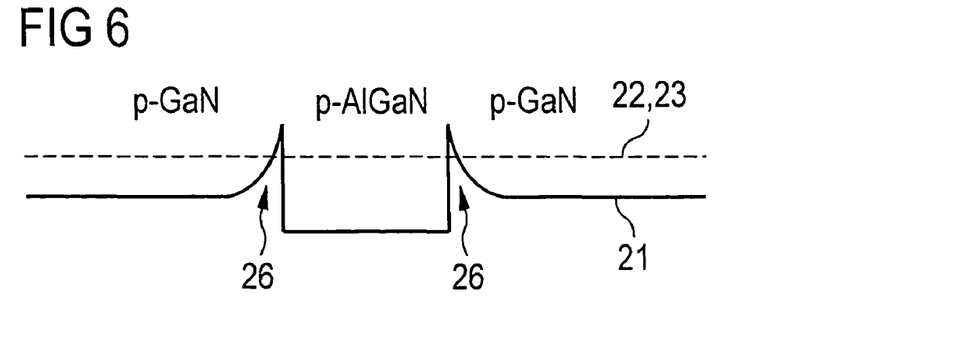
FIG. 6 shows a schematic illustration of the profile of the valence band edge of a p-doped semiconductor layer in which a p-doped semiconductor layer made of a second semiconductor material having a larger electronic band gap is embedded.

The current expansion layer and the semiconductor layer made of the second nitride compound semiconductor material that is embedded therein need not necessarily be n-doped in each case. As an alternative, both may also be p-doped, by way of example. FIG. 6 schematically shows the profile of the valence band edge 21 for the case of a p-doped AlGaN layer embedded in a p-doped GaN layer. In this case, at each of the interfaces a band bending occurs, which respectively represent potential wells 26 for holes. In this way, a two-dimensional hole gas may in each case be generated in the interface regions.

Figure 7A:
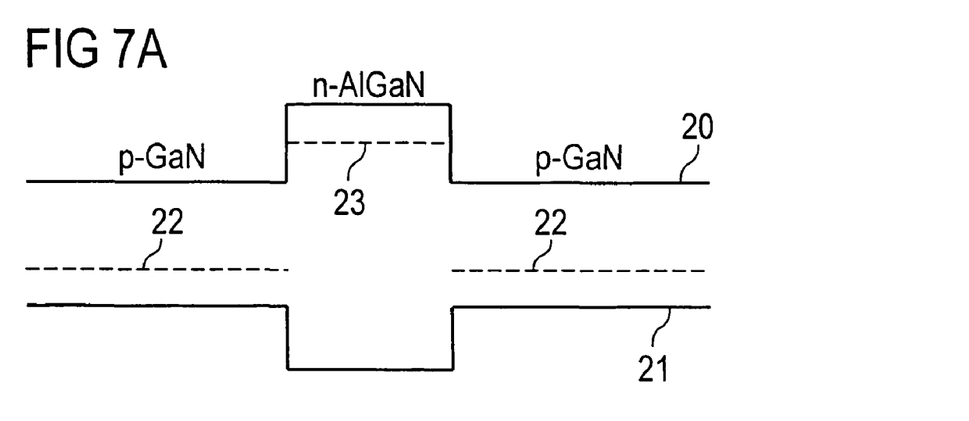
FIGS. 7A and 7B show a schematic illustration of the band model of a p-doped semiconductor layer in which an n-doped semiconductor layer made of a second semiconductor material having a larger electronic band gap is embedded.
Figure 7B:
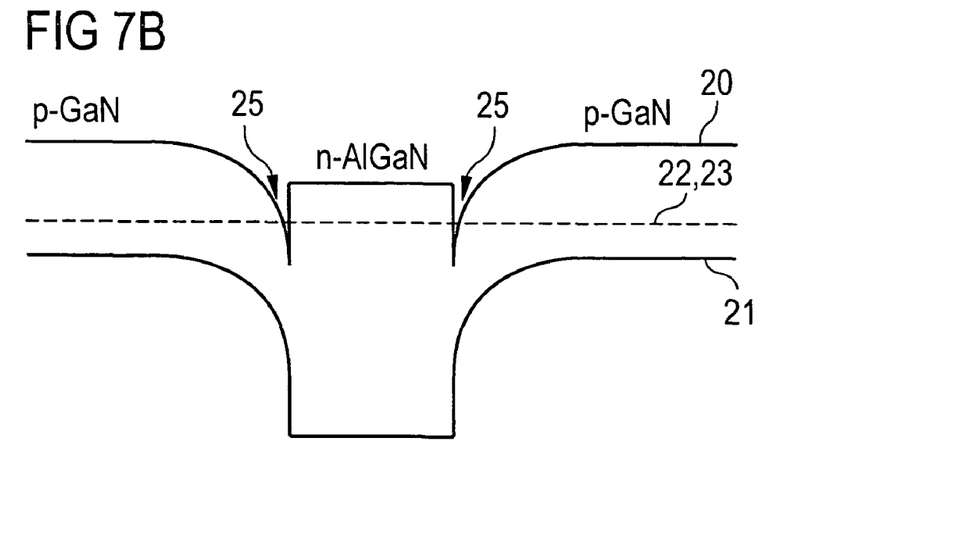

In a further preferred embodiment of the invention, in order to generate a two-dimensional electron gas within a p-doped current expansion layer, for example p-GaN, an n-doped layer, for example n-AlGaN, which has a larger electronic band gap than the p-doped layer, is embedded in the current expansion layer. The undisturbed band model of this embodiment is schematically illustrated in FIG. 7A and the band model taking account of the interaction of the semiconductor layers is schematically illustrated in FIG. 7B. Analogously to the example illustrated in FIG. 3B, wherein both the GaN layer and the embedded AlGaN layer are n-doped in each case, a respective potential well 25 for electrons forms, in this case, too, at the interface between the p-doped GaN and the n-doped AlGaN on account of the band bending at the semiconductor-semiconductor interfaces, by virtue of the formation of a two-dimensional electron gas, having an increased transverse conductivity.

The invention is not restricted by the description on the basis of the exemplary embodiments. Rather, the invention encompasses any new feature and also any combination of features, which in particular comprises any combination of features in the patent claims, even if this feature or this combination is itself not explicitly specified in the patent claims or exemplary embodiments.

The invention claimed is:

1. A thin-film LED comprising:
an active layer, which emits electromagnetic radiation in a main radiation direction;
a current expansion layer, which is disposed downstream of the active layer in the main radiation direction and is made of a first nitride compound semiconductor material;
a main area, through which the electromagnetic radiation emitted in the main radiation direction is coupled out; and
a first contact layer arranged on the main area,
wherein a transverse conductivity of the current expansion layer is increased by formation of a two-dimensional electron gas,
wherein at least one layer made of a second nitride compound semiconductor material having a larger electronic band gap than the first nitride compound semiconductor material is sandwiched in the current expansion layer to form the two-dimensional electron gas in the current expansion layer,
wherein the first and second nitride compound semiconductor materials are n-doped, and
wherein the at least one layer made of the second nitride compound semiconductor material is n-doped in a central region sandwiched between two interface regions each which adjoin the current expansion layer on respective sides of the central region, the second nitride compound semiconductor material being n-doped in the two interface regions which adjoin the current expansion layer, an n-type dopant concentration in said two interface regions being higher than an n-type dopant concentration in the central region of the at least one layer made of the second nitride compound semiconductor material.

2. The thin-film LED as claimed in claim 1, wherein a plurality of layers made of the second nitride compound semiconductor material are embedded in the current expansion layer.

3. The thin-film LED as claimed in claim 1, wherein the at least one layer made of the second nitride compound semiconductor material comprises a number of layers made of the second nitride compound semiconductor material, wherein the number of layers is between 1 and 5 inclusive.

4. The thin-film LED as claimed in claim 1, wherein the at least one layer made of the second nitride compound semiconductor material has a thickness of 10 nm to 100 nm.

5. The thin-film LED as claimed in claim 1, wherein the first nitride compound semiconductor material is GaN.

6. The thin-film LED as claimed in claim 1, wherein the second nitride compound semiconductor material is $Al_xGa_{1-x}N$ where $0.1 \leq x \leq 0.2$.

7. The thin-film LED as claimed in claim 1, wherein the active layer includes $In_xAl_yGa_{1-x-y}N$ where $0 \leq x \leq 1$, $0 \leq y \leq 1$ and $x+y \leq 1$.

8. The thin-film LED as claimed in claim 1, wherein at least one edge length of the main area is 400 μm or more.

9. The thin-film LED as claimed in claim 8, wherein at least one edge length of the main area is 800 μm or more.

10. The thin-film LED as claimed in claim 1, wherein operation of the thin-film LED with a current intensity of 300 mA or more is provided.

11. The thin-film LED as claimed in claim 1, wherein the first contact layer comprises no aluminum.

12. The thin-film LED as claimed in claim 1, wherein less than 15% of the total area of the main area is covered by the first contact layer.

13. The thin-film LED as claimed in claim 1, wherein the first contact layer has a lateral structure comprising a contact area and a plurality of contact webs.

14. The thin-film LED as claimed in claim 13, wherein the contact area is surrounded by at least one frame-type contact web, the frame-type contact web being connected to the contact area by means of at least one further contact web.

15. The thin-film LED as claimed in claim 14, wherein the frame-type contact web has a square, rectangular or circular form.

16. The thin-film LED as claimed in claim 14, wherein the number of frame-type contact webs is one, two or three.

17. The thin-film LED as claimed in claim 1, wherein a second contact layer, which reflects the electromagnetic radiation emitted by the active layer, is provided on a side of the active layer opposite to the first contact layer, the first contact layer having a contact area and the second contact layer having a cutout in a region opposite the contact area.

18. The thin-film LED as claimed in claim 1, wherein the current expansion layer includes two partial layers made of the first nitride compound semiconductor material separated from one another by the at least one layer made of the second nitride compound semiconductor material.

19. A thin-film LED comprising:
an active layer, which emits electromagnetic radiation in a main radiation direction;
a current expansion layer, which is disposed downstream of the active layer in the main radiation direction and is made of a first nitride compound semiconductor material;
a main area, through which the electromagnetic radiation emitted in the main radiation direction is coupled out; and
a first contact layer arranged on the main area,
wherein a transverse conductivity of the current expansion layer is increased by formation of a two-dimensional electron gas,
wherein at least one layer made of a second nitride compound semiconductor material having a larger electronic band gap than the first nitride compound semiconductor material is sandwiched in the current expansion layer to form the two-dimensional electron gas in the current expansion layer,
wherein the dopant concentration in the regions adjoining the current expansion layer is higher than in a dopant concentration in the current expansion layer,
wherein the first and second nitride compound semiconductor materials are n-doped, and
wherein the at least one layer made of the second nitride compound semiconductor material is n-doped in a central region sandwiched between two interface regions each which adjoin the current expansion layer on respective sides of the central region, the second nitride compound semiconductor material being n-doped in the two interface regions which adjoin the current expansion layer, an n-type dopant concentration in said two interface regions being higher than an n-type dopant concentration in the central region of the at least one layer made of the second nitride compound semiconductor material.

* * * * *